US009599646B2

(12) United States Patent
Yokoyama

(10) Patent No.: US 9,599,646 B2
(45) Date of Patent: Mar. 21, 2017

(54) POWER GENERATION APPARATUS

(71) Applicant: Sony Corporation, Tokyo (JP)

(72) Inventor: Masayuki Yokoyama, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 394 days.

(21) Appl. No.: 13/683,478

(22) Filed: Nov. 21, 2012

(65) Prior Publication Data
US 2013/0138259 A1 May 30, 2013

(30) Foreign Application Priority Data

Nov. 29, 2011 (JP) ................................. 2011-260771

(51) Int. Cl.
*G05D 3/12* (2006.01)
*G05D 5/00* (2006.01)
*G05D 9/00* (2006.01)
*G01R 21/00* (2006.01)
*G01R 31/40* (2014.01)
*G06F 17/00* (2006.01)
*H02J 13/00* (2006.01)
*H02J 7/35* (2006.01)
*H02S 50/10* (2014.01)

(52) U.S. Cl.
CPC ............ *G01R 21/00* (2013.01); *G01R 31/40* (2013.01); *G06F 17/00* (2013.01); *H02J 13/0003* (2013.01); *H02J 7/35* (2013.01); *H02S 50/10* (2014.12); *Y02E 40/72* (2013.01); *Y04S 10/123* (2013.01)

(58) Field of Classification Search
CPC ... G01R 31/40; G01R 21/00; H01L 31/02021; H02J 13/0003; H02J 7/35; G06F 17/00; Y02E 40/72; H02S 50/10; Y04S 10/123

USPC .................. 700/297, 298; 205/637; 136/244
See application file for complete search history.

(56) References Cited

U.S. PATENT DOCUMENTS

| 6,046,919 | A | * | 4/2000 | Madenokouji et al. ........ 363/98 |
| 2007/0119718 | A1 | * | 5/2007 | Gibson ..................... C25B 1/04 |
| | | | | 205/637 |
| 2008/0147335 | A1 | * | 6/2008 | Adest ..................... G01D 4/004 |
| | | | | 702/64 |
| 2008/0238195 | A1 | * | 10/2008 | Shaver et al. .................. 307/18 |
| 2009/0283129 | A1 | * | 11/2009 | Foss .............................. 136/244 |
| 2010/0084918 | A1 | * | 4/2010 | Fells et al. ...................... 307/32 |
| 2011/0016147 | A1 | * | 1/2011 | Fornage ................. G06Q 10/08 |
| | | | | 707/769 |
| 2011/0222327 | A1 | * | 9/2011 | Thompson .................... 363/135 |
| 2011/0224839 | A1 | * | 9/2011 | Thompson ..................... 700/297 |
| 2012/0053867 | A1 | * | 3/2012 | Dunn ..................... H02S 50/10 |
| | | | | 702/58 |
| 2012/0250379 | A1 | * | 10/2012 | D'Angelo ....................... 363/78 |
| 2012/0310427 | A1 | * | 12/2012 | Williams et al. ............. 700/287 |

FOREIGN PATENT DOCUMENTS

| JP | 09-102622 | 4/1997 |
| JP | 2010-287608 | 12/2010 |

* cited by examiner

*Primary Examiner* — Ziaul Karim
(74) *Attorney, Agent, or Firm* — Chip Law Group

(57) ABSTRACT

A power generation apparatus includes a power calculation unit configured to receive voltage information and temperature information from a power generation module, and calculate power generation information of the power generation module based on the received voltage information and temperature information.

22 Claims, 8 Drawing Sheets

POWER GENERATION APPARATUS

CROSS REFERENCES TO RELATED APPLICATIONS

The present application claims priority to Japanese Priority Patent Application JP 2011-260771 filed in the Japan Patent Office on Nov. 29, 2011, the entire content of which is hereby incorporated by reference.

BACKGROUND

The present disclosure relates to a power generation apparatus using a power generation module such as a solar cell module.

New energy systems such as a solar cell and a wind power generator using renewable energy have been recently used. For example, home power generator sets each including a solar cell module used for solar power generation on the roof of a house are becoming increasing popular. Such a solar cell module includes several tens of connected solar cells. More specifically, a solar cell module is obtained by connecting solar cells via internal wiring lines, disposing the solar cells on a tempered glass sheet so that the light-receiving surfaces of the solar cells face the tempered glass, and covering the opposite surfaces of the solar cells with a resin. A voltage output from a single or a plurality of solar cell modules is supplied to a power conditioner, and ac power is extracted from the power conditioner and is then transmitted to a power system. An apparatus having the above-described structure is called a solar power generation apparatus.

The current output power of a solar power generation apparatus in operation can be displayed to be notified to a home user. Furthermore, by monitoring the power generation state of a power generation apparatus, the abnormal state of the power generation apparatus can be detected.

For example, Japanese Unexamined Patent Application Publication No. 2010-287608 discloses a method of detecting degradation in a solar cell module by measuring the output current and temperature of the solar cell module and comparing a power generation current value with an ideal current value based on the measured temperature. Japanese Unexamined Patent Application Publication No. 9-102622 discloses a technique for determining that the failure of a solar cell has occurred when the energized state of a current relay, which uses a bypass diode as a power source and is connected in series to the bypass diode, has continued for a predetermined period.

SUMMARY

In the method disclosed in Japanese Unexamined Patent Application Publication No. 2010-287608, in order to measure a power generation current value of a solar cell module, a resistor used to measure a value of a current is disposed on a current path. This leads to the increase in a power loss. Furthermore, since the value of a power generation current is relatively large, the rate of component failure caused from a current and generated heat becomes high.

In the technique disclosed in Japanese Unexamined Patent Application Publication No. 9-102622, a current relay is also disposed on a current path. Accordingly, the rate of component failure caused from the increase in a power loss, a current, and generated heat becomes high. Furthermore, only information about whether a solar cell module can perform power generation is obtained and is not used for power management.

It is desirable to provide a power generation apparatus capable of solving these problems.

In an embodiment, a power generation apparatus includes a power calculation unit configured to receive voltage information and temperature information from a power generation module, and calculate power generation information of the power generation module based on the received voltage information and temperature information. In another embodiment, a method of determining an operating state of a power generation apparatus includes receiving voltage information and temperature information from a power generation module, and calculating power generation information of the power generation module based on the received voltage information and temperature information, and determining the operating state of the power generation module based on the power generation information.

According to an embodiment of the present disclosure, a power generation current is not detected. Accordingly, the rate of component failure caused from the increase in a power loss, a current, and generated heat can be prevented from being increased.

Additional features and advantages are described herein, and will be apparent from the following Detailed Description and the figures.

DETAILED DESCRIPTION

Embodiments to be described below are preferred embodiments of the present disclosure and various technically-preferable limitations are given. However, it should be noted that the scope of the present disclosure is not limited to these embodiments unless a description limiting the present disclosure is given in the following description.

First Embodiment

Outline of Power Generation Apparatus

Figure 1:
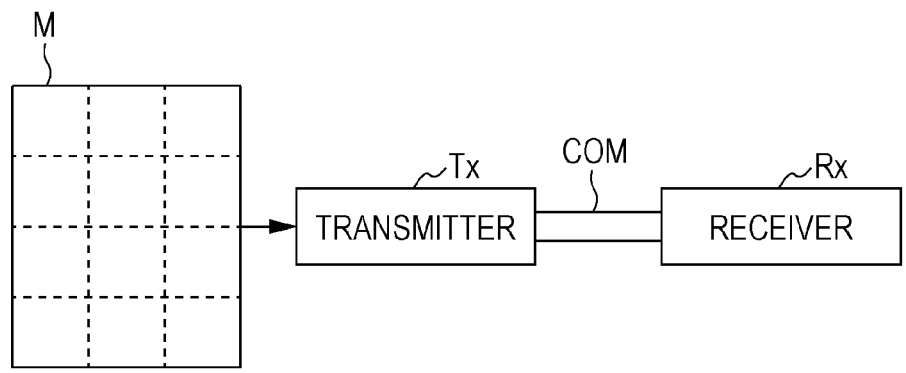
FIG. 1 is a schematic block diagram of a power generation apparatus according to an embodiment of the present disclosure.

The first embodiment of the present disclosure will be described. As illustrated in FIG. 1, in the first embodiment, a solar cell module M and a transmitter Tx are connected. Pieces of information about the voltage and temperature of the solar cell module M are supplied to the transmitter Tx, and are then transmitted to a receiver Rx via a communication path COM.

The receiver Rx uses the received temperature information and the received voltage information to calculate power on the basis of a model (for example an equivalent circuit) of a solar cell or a solar cell module. The receiver Rx includes a display unit and can display the calculated amount of power on the display unit. The receiver Rx further includes a determination unit for determining the state of the power generation module M on the basis of the amount of power, and can determine the deterioration and failure of the power generation module M with the determination unit.

The communication path COM may be a wired or wireless connection. Examples of a communication method include a method using a communication interface such as a Universal Asynchronous Receiver-Transceiver (UART), a wireless communication method compliant with Bluetooth, ZigBee, Wi-Fi, or ANT+, and a wired communication method that uses a power transmission path for a solar cell module or another cable compliant with, for example, Ethernet (registered trademark).

Figure 2:
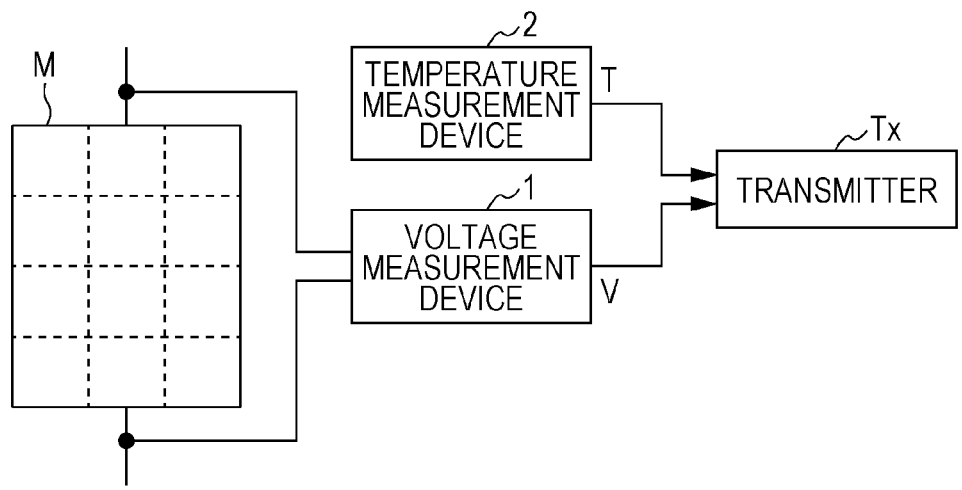
FIG. 2 is a schematic block diagram of a power generation apparatus according to a first embodiment of the present disclosure.

As illustrated in FIG. 2, on a transmission side, a voltage measurement device 1 for measuring an output voltage V (power generation voltage) of the solar cell module M and a temperature measurement device 2 for measuring a temperature T of the solar cell module M are provided. The measured voltage V and the measured temperature T are transmitted from the transmitter Tx in a wireless or wired communication manner. On the transmission side, the measurement of a current is not performed. Accordingly, a power loss caused by a current detection resistor is not generated.

Figure 3:
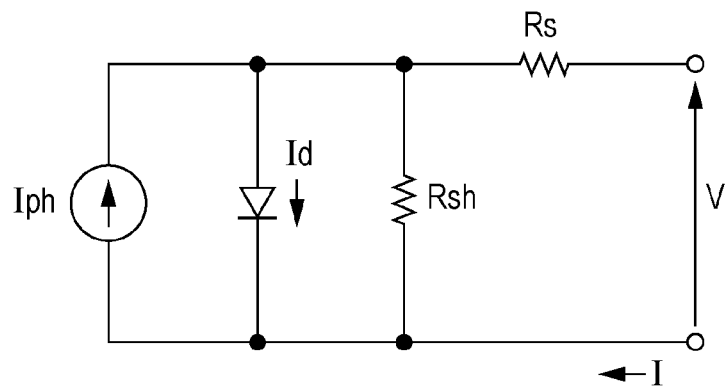
FIG. 3 is a connection diagram of an exemplary equivalent circuit of a solar cell.

On a receiving side, power generated by a solar cell module is calculated with the measured voltage V and the measured temperature T of the solar cell module. In this case, a model (for example an equivalent circuit) of a solar cell module illustrated in FIG. 3 is used. A method of calculating generated power will be described below.

[Calculation of Generated Power]

For example, in order to calculate power with the voltage V and the temperature T, a solar cell module is modeled in advance. FIG. 3 is a diagram illustrating an example in which a solar cell module is modeled in the form of an equivalent circuit. In an equivalent circuit, a current source, a diode, and a resistor are connected in parallel, and another resistor is connected in series to the parallel connection. Referring to FIG. 3, the current source corresponds to an electromotive force, and Iph represents a current source component. The sum total of resistances of a substrate, a light-receiving layer, and an electrode portion of a solar cell module is represented by a series resistance component Rs. The loss resistance of the solar cell module is represented by a parallel resistance component Rsh.

The current source component Iph, the series resistance component Rs, the parallel resistance component Rsh, and the characteristic of the diode are calculated in advance. The characteristic of the diode can be modeled with a Shockley diode equation (equation (1)).

$$I_d = I_o \left\{ \exp\left(\frac{qV_d}{nkT}\right) - 1 \right\} \quad (1)$$

In equation (1), Io represents a reverse saturation current (A), n represents an ideal diode factor, q represents an elementary charge $(1.60217733 \times 10^{-19}(C))$, k represents a Boltzmann constant $(1.3806504 \times 10^{-23}(JK^{-1}))$, and T represents a temperature (K).

By applying the Kirchhoff's law to the equivalent circuit illustrated in FIG. 3, the following equation (2) is obtained.

$$I = I_{ph} - I_d - \frac{V + R_s I}{R_{sh}} \quad (2)$$

The following equation (3) is obtained from equations (1) and (2).

$$I = I_{ph} - I_o \left\{ \exp\left(\frac{q(V + R_s I)}{nkT}\right) - 1 \right\} - \frac{V + R_s I}{R_{sh}} \quad (3)$$

The unknown variables Io, n, Rs, and Rsh are constant regardless of environment. Accordingly, by preparing pieces of actual measurement data of the set of I, V, and T, the number of which is equal to or larger than that of unknowns, and solving simultaneous equations, these unknown variables can be determined. Iph is a variable dependent on an illumination level. For example, it is assumed that the variable Iph is linearly proportional to an illumination level. Simultaneous equations can be solved by preparing pieces of actual measurement data of the set of I, V, T, and an illumination level, the number of which is equal to or larger than that of unknowns.

Thus, unknowns other than I, V, and T in the above-described equation can be determined. Accordingly, when V, T, and Iph (or an illumination level) are obtained, I can be determined and generated power (the voltage V×the current I=generated power) can be calculated.

Figure 4:
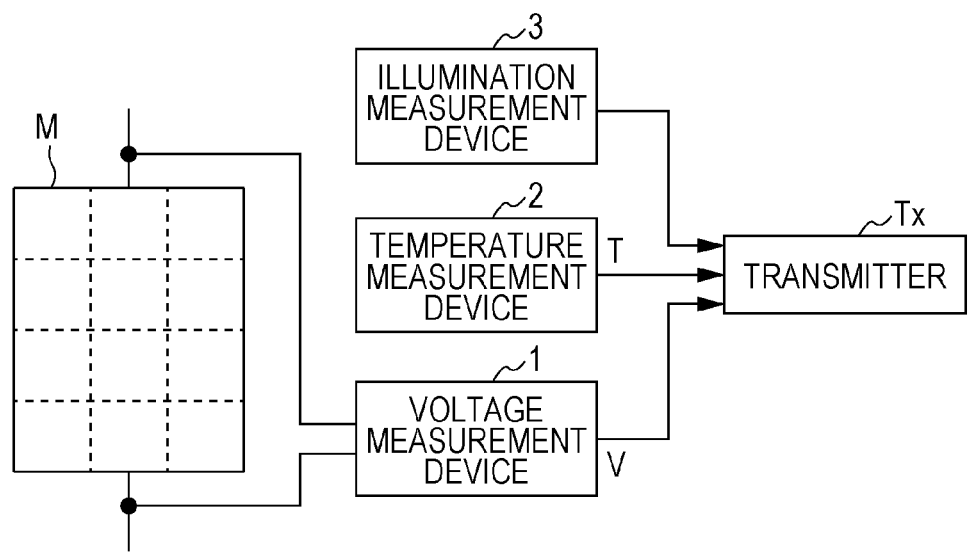
FIG. 4 is a schematic block diagram of a modification of a power generation apparatus according to an embodiment of the present disclosure.

In order to determine Iph or an illumination level, the method illustrated in, for example, FIG. 4 can be considered. In this method, an illumination measurement device 3 is disposed, and a short circuit current obtained when the terminals of a solar cell module become shorted or an open circuit voltage obtained when the terminals of the solar cell module are opened, which is a parameter substantially proportional to an illumination level, is measured. However, in this case, a device for measuring an illumination level has to be disposed.

On the other hand, many power conditioners for solar cells have a Maximum Power Point (MPP) function (a maximum operating point control function) in which control processing is performed to obtain the maximum operating point at which power becomes the maximum in a current-voltage characteristic of a solar cell. With a power conditioner having the MPP function, in a case where T and V are determined, Iph can be determined. As a result, I can be determined. For example, the detailed description is as follows.

In general, a maximum operating point voltage Vpm of a solar cell is substantially linearly proportional to an open voltage Voc in an environment in which an illumination level is relatively high. For example, in the case of a crystalline silicon solar cell, Vpm is approximately 80% of Voc. In consideration of this, an equation obtained by setting I=0 and using Voc in the equation (3) is as follows.

$$I_{ph} - I_o\left\{\exp\left(\frac{qV_{oc}}{nkT}\right) - 1\right\} - \frac{V_{oc}}{R_{sh}} = 0 \qquad (4)$$

In a case where equation (4) is deformed with a coefficient of c=Vpm/Voc (for example 0.8), Iph is determined as follows.

$$I_{ph} = I_o\left\{\exp\left(\frac{qV_{pm}}{cnkT}\right) - 1\right\} + \frac{V_{pm}}{cR_{sh}} \qquad (5)$$

With equations (3) and (5), equation (6) used to derive Ipm from Vpm and T can be obtained.

$$I_o\left\{\exp\left(\frac{qV_{pm}}{cnkT}\right) - \exp\left(\frac{q(V_{pm} + R_s I_{pm})}{nkT}\right)\right\} + \frac{V_{pm}}{cR_{sh}} - \frac{V_{pm} + R_s I_{pm}}{R_{sh}} - I_{pm} = 0 \qquad (6)$$

In equation (6), variables other than Ipm can be calculated in advance as described previously or can be determined with data from a transmitter. Accordingly, Ipm, which is only one unknown variable in equation (6), can be calculated with, for example, a Newton method. Alternatively, Ipm can be calculated by performing a Taylor expansion on an exponent and then solving a polynomial expression.

[Exemplary Configuration on Transmission Side]

An example of a configuration on a transmission side will be described with reference to FIG. 5. Two solar cell modules M1 and M2 are connected in series. A voltage output from the series connection of the solar cell modules M1 and M2 is supplied to a power conditioner PW. The power conditioner PW is used to convert a generated dc voltage into an ac voltage and supply generated power to a commercial power supply system. The power conditioner PW has the MPP function (the maximum operating point control function) in which control processing is performed to obtain the maximum operating point at which power becomes the maximum in a current-voltage characteristic of a solar cell.

Voltage and temperature measurement units $10_1$ and $10_2$ are connected to the solar cell module M1 and M2, respectively. Since the voltage and temperature measurement units $10_1$ and $10_2$ have the same configuration, only the detailed configuration of the voltage and temperature measurement unit $10_1$ is illustrated in FIG. 5.

A voltage output from the solar cell module M1 is supplied to a regulator 11, and is divided by resistors 12 and 13. The regulator 11 stabilizes the output of the solar cell module M1 and outputs a dc voltage +Vcc1. In a case where the output voltage of the solar cell module M1 is higher than the rated voltage of the regulator 11, the output voltage of the solar cell module M1 is divided and is then supplied to the regulator 11.

A voltage at a point of connection between the resistors 12 and 13 is input into an overvoltage protection circuit (OVP in FIG. 5) 14. The overvoltage protection circuit 14 performs control processing so as to prevent the voltage at the point of connection between the resistors 12 and 13 from being equal to or higher than the input rated voltage of an A/D converter (ADC in FIG. 5) 15 at the subsequent stage. Voltage data V1 is obtained from the A/D converter 15.

The output voltage of the regulator 11 is supplied to the series connection of a resistor 16 and a thermistor 17. The thermistor 17 is, for example, a negative temperature coefficient thermistor, and has a resistance value corresponding to the temperature of the solar cell module M1. A temperature detection element is preferably disposed so that it can measure the surface temperature of a solar cell module. An element other than a thermistor may be used as a temperature detection element. A plurality of temperature detection elements may be disposed for the solar cell module M1 at different positions, and more accurate temperature detection may be performed with the outputs of these temperature detection elements. A voltage at the point of connection between the resistor 16 and the thermistor 17 is supplied to an A/D converter 18. Temperature data T1 is obtained from the A/D converter 18. The regulator 11 also functions as a power source for the A/D converters 15 and 18, and the output voltage +Vcc1 of the regulator 11 is supplied to the A/D converters 15 and 18.

An identifier (ID) storage unit 19 is disposed, and an ID ID1 of the solar cell module M1 is output from the ID storage unit 19. The voltage data V1, the temperature data T1, and the ID ID1 of the solar cell module M1 are supplied to a multiplexer 20.

Like the voltage and temperature measurement unit $10_1$, the voltage and temperature measurement unit $10_2$ for the solar cell module M2 outputs voltage data V2, temperature data T2, an ID ID2, and a voltage +Vcc2. These pieces of data are supplied to the multiplexer 20. A power supply voltage +Vcc for the multiplexer 20 and the transmitter Tx is obtained from one of the voltages +Vcc1 and +Vcc2.

The multiplexer 20 multiplexes (for example time-division multiplexes) pieces of data pertaining to the solar cell modules M1 and M2 and supplies the multiplexed data to the transmitter Tx. The transmitter Tx is a radio transmitter, and includes an antenna. The measurement of a voltage and a temperature is performed at predetermined intervals.

Since a multiplexer is disposed, pieces of data pertaining to a plurality of solar cell modules are transmitted from a single transmitter. However, a transmitter may be disposed for each solar cell module. In a case where there is a long distance between solar cell modules, it is better to dispose a transmitter for each solar cell module for the sake of simple wiring.

Figure 5:
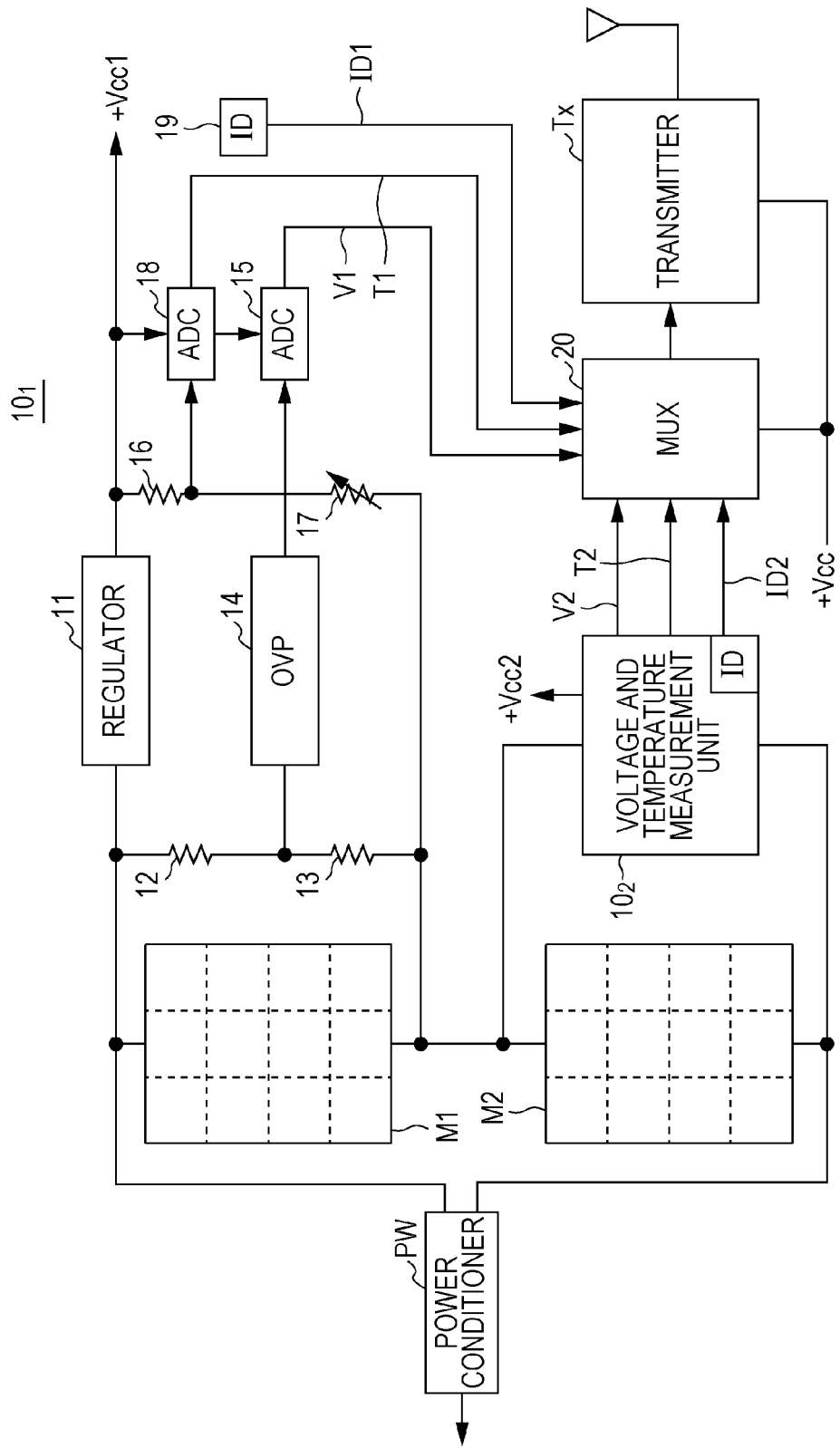
FIG. 5 is a block diagram illustrating a configuration on a transmission side of a power generation apparatus according to the first embodiment.

Although not illustrated in FIG. 5, a control unit for controlling the transmission side including a power generator is disposed. The control unit is, for example, a microcomputer, and controls each unit on the transmission side by executing a program.

[Process on Transmission Side]

Figure 6:
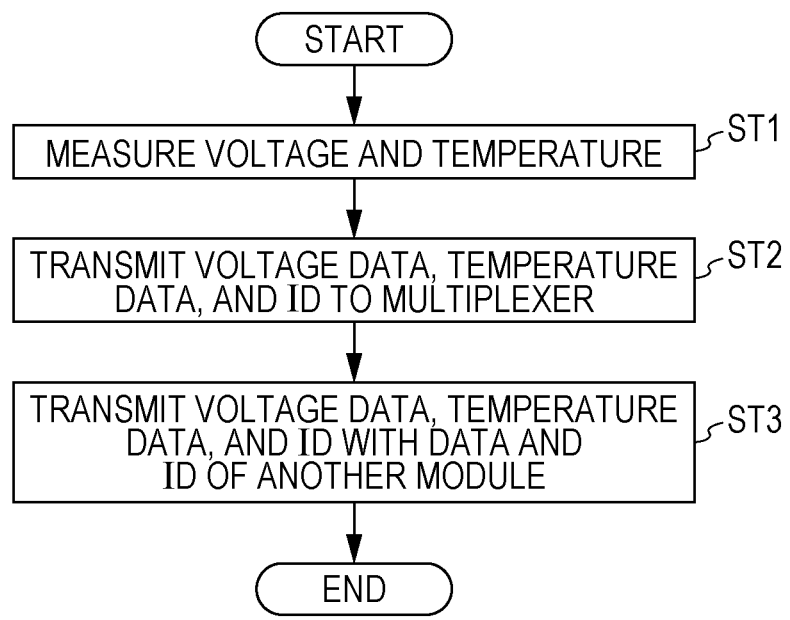
FIG. 6 is a flowchart describing a process performed on a transmission side according to the first embodiment.

A process illustrated in FIG. 6 is performed for the transmission side, for example, the solar cell module M1 under the control of the control unit. In step ST1, the voltage and temperature measurement unit $10_1$ measures the voltage and temperature of the solar cell module M1.

In step ST2, voltage data and temperature data which are results of the measurement are supplied to the multiplexer 20 along with the ID ID1. In step ST3, these pieces of data and the ID ID1 are multiplexed with the voltage data, temperature data, and ID2 of another module (the solar cell module M2) and are transmitted from the transmitter Tx. Thus, the pieces of data of the measured voltage and temperature are transmitted to the receiver Rx along with an ID.

[Exemplary Configuration of Receiver]

An example of the configuration of a receiver will be described with reference to FIG. 7. The receiver Rx receives a signal from the transmitter Tx, performs receiving processing upon the received signal, and supplies the processed data to a demultiplexer 30. The demultiplexer 30 demultiplexes the multiplexed data and outputs IDs and pieces of measurement data.

The ID ID1 output from the demultiplexer 30 is supplied to an authentication unit 32 in a power calculation and state determination section $31_1$. The authentication unit 32 compares the received ID with the ID ID1 registered in advance and performs authentication on the basis of a result of the comparison. At that time, a more complex authentication method such as mutual authentication may be performed.

The voltage data V1 and the temperature data T1 are supplied from the demultiplexer 30 to a power calculation unit 33. The power calculation unit 33 calculates the current Iph generated by the solar cell module M1 with equations (1) to (6) acquired from the above-described equivalent circuit model of the solar cell module, and obtains power information P1 about power generated by the solar cell module M1 with the calculated current and the voltage data.

The power information P1 obtained by the power calculation unit 33 is supplied to a state determination unit 34. The state determination unit 34 determines whether the solar cell module M1 is in a good state on the basis of the power information P1. The state determination unit 34 determines the failure and deterioration of the power generation module M1, and outputs a determination signal St1 (for example several bits of digital data).

In order to determine a power generation state on the basis of power information, the state determination unit 34 may use one of or the combination of the following methods.

1. A method of determining that a power generation abnormal state occurs when generated power equal to or smaller than a predetermined value lasts for a predetermined period.
2. A method of determining that a power generation abnormal state occurs when generated power is lower than that of an adjacent module by a predetermined value.
3. A method of determining that a power generation abnormal state occurs when total generated power in a predetermined period is lower than the past total generated power by a predetermined value.

The power information P1 and the determination signal St1 output from the power calculation and state determination section $31_1$ are supplied to the display unit 40. The display unit 40 includes a display element such as a Liquid Crystal Display (LCD) and a display control unit.

The ID ID2, the voltage data V2, and the temperature data T2 output from the demultiplexer 30 are supplied to a power calculation and state determination section $31_2$. The power calculation and state determination section $31_2$ has a configuration similar to that of the power calculation and state determination section $31_1$, and outputs power information P2 and a determination signal St2. The power information P2 and the determination signal St2 are supplied to the display unit 40.

The display unit 40 displays power generated by each solar cell module and an information determination result of each solar cell module. The display unit 40 may further display total power generated by all solar cell modules. A user can know the current power generation state of each solar cell module by seeing the display unit 40. The amount of power and the state do not necessarily have to be displayed, and may be used for processing other than display processing and control processing. For example, with output power information, automatic tracking control may be performed so that the panel of each solar cell module points at the sun.

Figure 7:
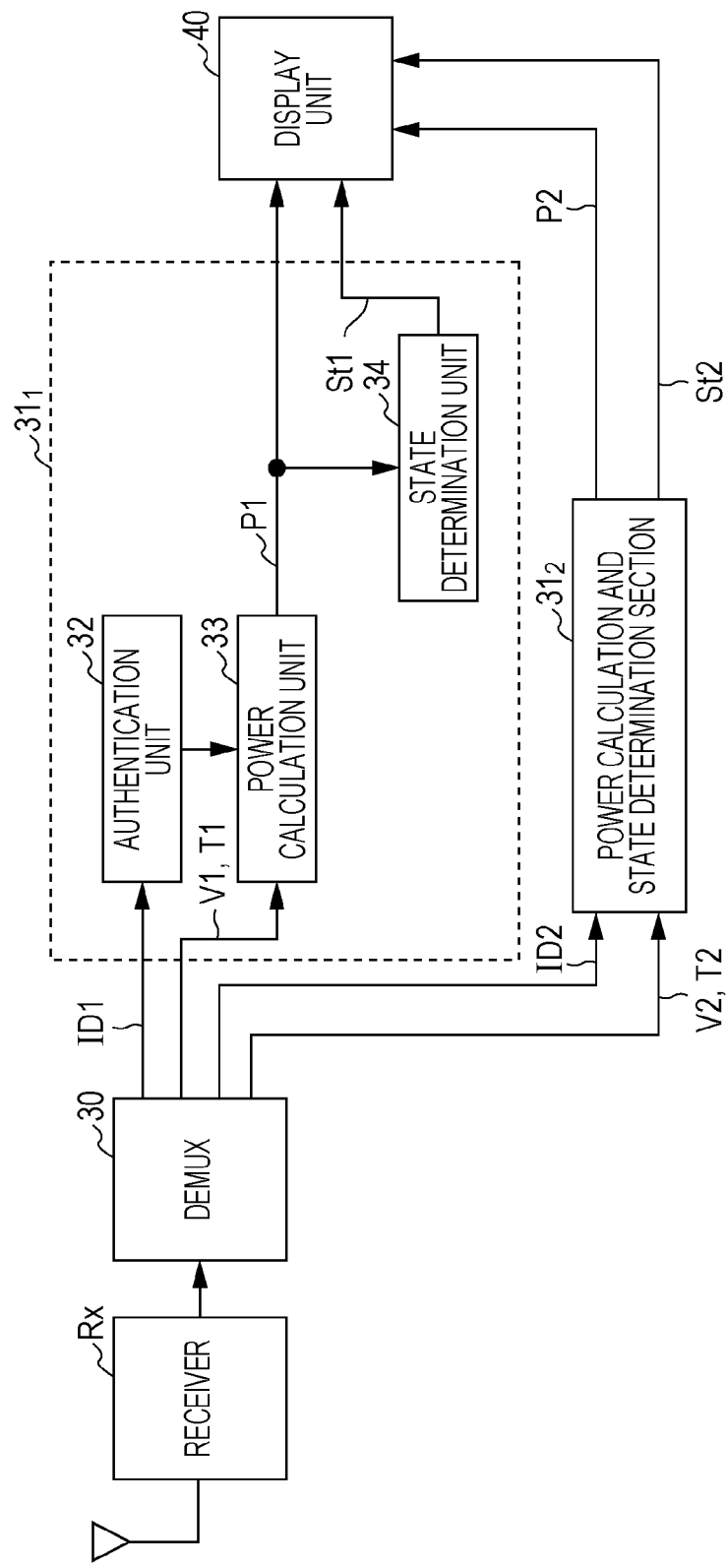
FIG. 7 is a block diagram illustrating a configuration on a receiving side of a power generation apparatus according to the first embodiment.

Although not illustrated in FIG. 7, a control unit for controlling the receiving side is disposed. The control unit is, for example, a microcomputer, and controls each unit on the receiving side by executing a program. The function of each power calculation and state determination section can be performed by software processing by a Micro Processing Unit (MPU) or a Digital Signal Processor (DSP).

[Process on Receiving Side]

Figure 8:
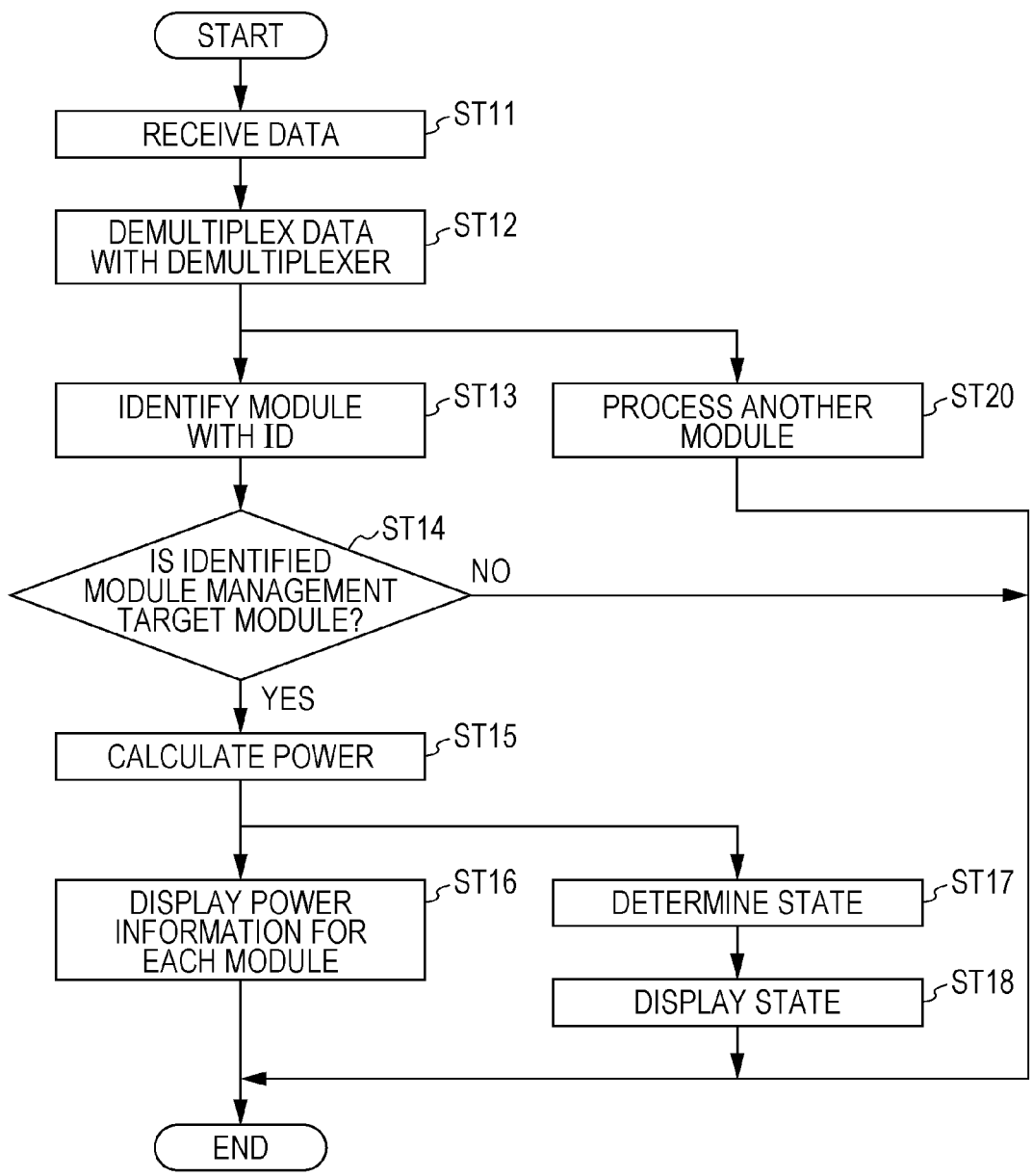
FIG. 8 is a flowchart describing a process performed on a receiving side according to the first embodiment.

A process illustrated in FIG. 8 is performed on the receiving side under the control of the control unit. In step ST11, the receiver Rx receives data and outputs the received data to the demultiplexer 30. In step ST12, the demultiplexer 30 demultiplexes the data.

In step ST13, a solar cell module is identified with the ID ID1 demultiplexed from the data. In step ST14, it is determined whether the identified solar cell module is a management target solar cell module. In a case where it is determined that the identified solar cell module is not a management target solar cell module, the process ends. On the other hand, in a case where it is determined in step ST14 that the identified solar cell module is a management target solar cell module, the calculation of power is performed with the above-described equivalent circuit model in step ST15.

In step ST16, the display unit 40 displays power information for each solar cell module. At the same time, in step ST17, the above-described state determination is performed with power information acquired from the calculation. For example, in a case where there is little generated power, it is determined that the solar cell module has failed. In a case where generated power is equal to or smaller than a predetermined value, the generated power is converted into the degree of deterioration and the degree of deterioration is displayed. The process ends.

A process (represented by step ST20 in FIG. 8) similar to the process from steps ST13 to ST18 is performed on another solar cell module (for example the solar cell module M2).

Second Embodiment

Figure 9:
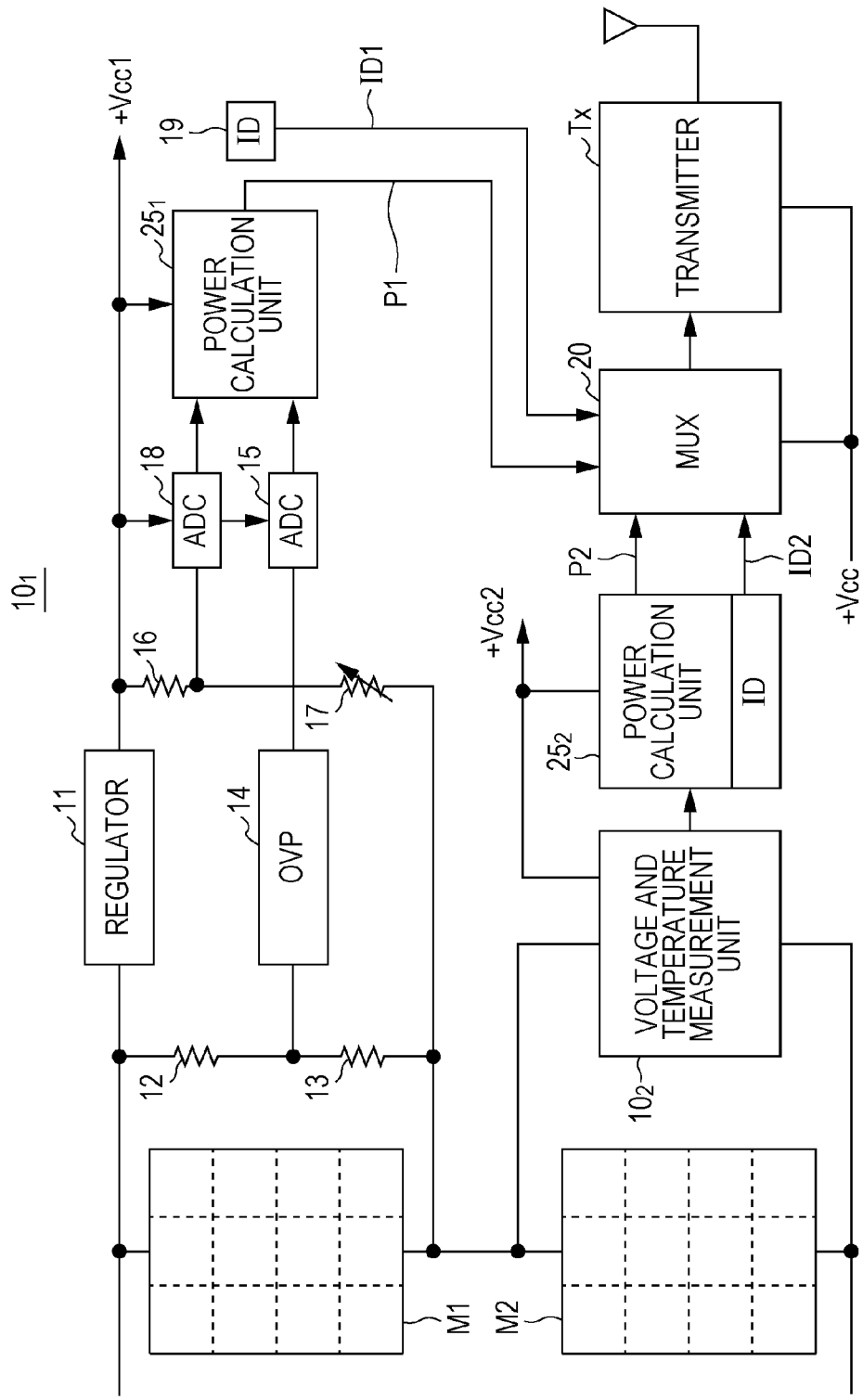
FIG. 9 is a block diagram illustrating a configuration on a transmission side of a power generation apparatus according to a second embodiment of the present disclosure.

FIG. 9 is a diagram illustrating a configuration on a transmission side according to the second embodiment of the present disclosure. Referring to FIG. 9, the same reference numerals are used to identify parts already described with reference to FIG. 5. In the second embodiment, a power calculation unit is disposed for each solar cell module on the transmission side. For example, a power calculation unit $25_1$ is disposed for the solar cell module M1 on the transmission side, and obtains the power information P1 of the solar cell module M1 by calculation like in the first embodiment.

The power information P1 output from the power calculation unit $25_1$ and the ID ID1 are supplied to the multiplexer 20. A power calculation unit $25_2$ is disposed for the solar cell module M2. The power information P2 output from the power calculation unit $25_2$ and the ID ID2 are supplied to the multiplexer 20. The multiplexer 20 multiplexes the pieces of power information P1 and P2 and the IDs ID1 and ID2, and supplies the multiplexed data to the transmitter Tx. The transmitter Tx transmits the multiplexed data.

A receiving side, the illustration of which is omitted, can receive power information itself, and therefore include no power calculation unit. Other than this point, the receiving side has the same configuration as that illustrated in FIG. 7.

Third Embodiment

In the first embodiment, a power calculation unit is disposed on a receiving side. In the second embodiment, a power calculation unit is disposed on a transmission side. In the third embodiment of the present disclosure, as illustrated in FIG. 10, a power calculation unit is disposed at a position outside a receiving side and a transmission side.

Figure 10:
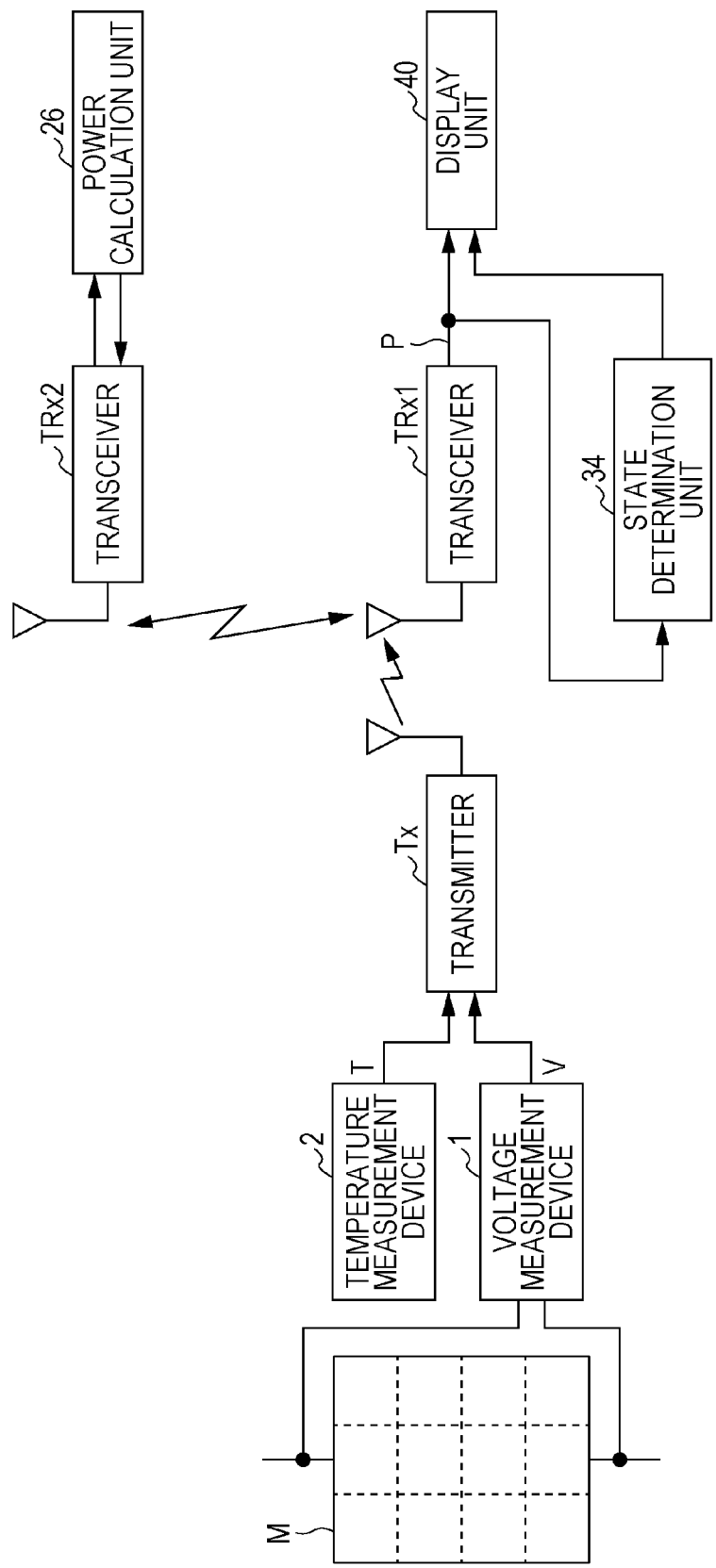
FIG. 10 is a block diagram illustrating a schematic configuration of a power generation apparatus according to a third embodiment of the present disclosure.

FIG. 10 is a diagram illustrating a schematic configuration according to the third embodiment. The voltage and temperature of a solar cell module M are measured by the voltage measurement device 1 and the temperature measurement device 2, respectively. The transmitter Tx transmits these pieces of data.

A transceiver TRx1 transmits received data to a transceiver TRx2 disposed at another place (for example a server or a cloud computer). The transceiver TRx2 supplies received voltage data and received temperature data to a power calculation unit 26. The power calculation unit 26 obtains power information P of the solar cell module M by calculation like in the first embodiment. The obtained power information P is supplied to the transceiver TRx2 and is transmitted from the transceiver TRx2.

The transceiver TRx1 receives the power information P from the transceiver TRx2, and displays the received power information P on the display unit 40. The power information P is also supplied to a state determination unit 34. The failure and deterioration of the solar cell module M are determined, and a result of the determination is supplied to the display unit 40.

Effect of Embodiment

According to the above-described embodiments, the following effects are obtained. Since power management can be performed for each solar cell module, the occurrence of a failure and a shadow and the amount of generated power in each of the cardinal points can be easily determined. Since the characteristic of each solar cell module, which causes a failure, can be determined, a solar power generation system can be easily subjected to maintenance. A small and low-cost apparatus including a small number of components can be attached to each solar cell module. Since no component is disposed on a power transmission path of each solar cell module, an apparatus seldom produces trouble.

An embodiment of the present disclosure can be configured as follows.

(1) A power generation apparatus comprising: a power calculation unit configured to receive voltage information and temperature information from a power generation module, and calculate power generation information of the power generation module based on the received voltage information and temperature information.

(2) The power generation apparatus according to (1), further comprising a state determination unit configured to determine an operating state of the power generation module based on the power generation information.

(3) The power generation apparatus according to (2), wherein the state determination unit is configured to detect a deteriorated state or a failed state of the power generation module.

(4) The power generation apparatus according to (1), further comprising an output unit configured to output the power generation information.

(5) The power generation apparatus according to (4), wherein the output unit is a display unit configured to display the power generation information.

(6) The power generation apparatus according to (1), further comprising a transmitter configured to transmit the voltage information and temperature information, and a receiver communicatively coupled to the transmitter and configured to receive the voltage information and temperature information transmitted by the transmitter.

(7) The power generation apparatus according to (6), wherein a communication path between the receiver and the transmitter is a wireless connection.

(8) The power generation apparatus according to (6), further comprising a voltage and temperature measurement unit configured to measure the voltage information and temperature information from the power generation module, and configured to transfer said voltage information and temperature information to the transmitter.

(9) The power generation apparatus according to (8), wherein the voltage and temperature measurement unit comprises: a regulator configured to stabilize a voltage output from the power generation module, and first and second resistors connected to the regulator and configured to divide the voltage output from the power generation module in a case where the voltage output from the power generation module is higher than a rated voltage of the regulator.

(10) The power generation apparatus according to (8), further comprising: a plurality of voltage and temperature measurement units corresponding to a plurality of power generation modules, the plurality of power generation modules being connected in series; and a multiplexer configured to combine the voltage information and temperature information output from the plurality of voltage and temperature measurement units.

(11) The power generation apparatus according to (10), further comprising an identifier storage unit configured to supply identification information of the respective power generation modules to the multiplexer, wherein the multiplexer is configured to combine the voltage information, the temperature information, and the identification information of the respective power generation modules.

(12) The power generation apparatus according to (11), further comprising a demultiplexer connected to the receiver, the demultiplexer configured to demultiplex the data received from the multiplexer and output the voltage information, the temperature information, and the identification information of the respective power generation modules.

(13) The power generation apparatus according to (12), wherein the power calculation unit further comprises an authentication unit configured to perform an authentication of the respective power generation modules based on received identification information.

(14) The power generation apparatus according to (10), wherein a voltage output from the series connection of the plurality of power generation modules is supplied to a power conditioner that is configured to convert a generated DC voltage into an AC voltage and supply the generated power to an external power supply system.

(15) The power generation apparatus according to (10), further comprising a state determination unit configured to determine an operation state of the power generation module by doing at least one of: (a) determining that a power generation abnormal state occurs when generated power of a given power generation module is equal to or smaller than a predetermined value and lasts for a predetermined period; (b) determining that a power generation abnormal state occurs when generated power a given power generation module is lower than that of an adjacent power generation module by a predetermined value; and (c) determining that a power generation abnormal state occurs when total generated power in a predetermined period is lower than a past total generated power by a predetermined value.

(16) The power generation apparatus according to (1), further comprising: a transmitter; a receiver communicatively coupled to the transmitter; and a state determination unit configured to determine an operating state of the power generation module based on the power generation information received by the receiver.

(17) The power generation apparatus according to (16), wherein the power calculation unit is positioned on a transmission side of the power generation apparatus, and the state determination unit is positioned on a reception side of the power generation apparatus.

(18) The power generation apparatus according to (16), wherein the power calculation unit and the state determination unit are positioned on a reception side of the power generation apparatus.

(19) The power generation apparatus according to (16), wherein the state determination unit is positioned on a reception side of the power generation apparatus, and the power calculation unit is located at a position outside a transmission side and the reception side of the power generation apparatus.

Another embodiment of the present disclosure can be configured as follows.

(20) A method of determining an operating state of a power generation apparatus, the method comprising: receiving voltage information and temperature information from a power generation module, and calculating power generation information of the power generation module based on the received voltage information and temperature information; and determining the operating state of the power generation module based on the power generation information.

(21) The method according to (20), further comprising determining an operating state of the power generation module based on the power generation information.

(22) The method according to (21), further comprising determining if the operating state of the power generation module is a deteriorated state or a failed state.

(23) The method according to (20), further comprising outputting the power generation information.

(24) The method according to (23), wherein outputting the power generation information includes displaying the power generation information on a display device.

(25) The method according to (20), further comprising transmitting the voltage information and temperature information by a transmitter, and receiving the transmitted voltage information and temperature information by a receiver.

(26) The method according to (25), wherein a communication path between the transmitter and receiver is a wireless connection.

(27) The method according to (25), further comprising measuring the voltage information and temperature information from the power generation module by a voltage and temperature measurement unit, and transferring said voltage information and temperature information to the transmitter.

(28) The method according to (27), wherein the voltage and temperature measurement unit comprises: a regulator configured to stabilize a voltage output from the power generation module, and first and second resistors connected to the regulator and configured to divide the voltage output from the power generation module in a case where the voltage output from the power generation module is higher than a rated voltage of the regulator.

(27) The method according to (27), wherein the power generation apparatus further includes a plurality of voltage and temperature measurement units corresponding to a plurality of power generation modules, the plurality of power generation modules being connected in series, and the method further comprises: combining the voltage information and temperature information output from the plurality of voltage and temperature measurement units with a multiplexer.

(30) The method according to (29), wherein the power generation apparatus further includes an identifier storage unit configured to supply identification information of the respective power generation modules to the multiplexer, and the method further comprises: combining the voltage information, the temperature information, and the identification information of the respective power generation modules with the multiplexer.

(31) The method according to (30), wherein the power generation apparatus further includes a demultiplexer connected to the receiver, the method further comprising: demultiplexing the data received from the multiplexer and outputting the voltage information, the temperature information, and the identification information of the respective power generation modules.

(32) The method according to (31), further comprising performing an authentication of the respective power generation modules based on received identification information.

(33) The method according to (29), further comprising supplying a voltage output from the series connection of the plurality of power generation modules to a power conditioner that is configured to convert a generated DC voltage into an AC voltage and supply the generated power to an external power supply system.

(34) The method according to (29), further comprising determining an operation state of the power generation module by doing at least one of:

(a) determining that a power generation abnormal state occurs when generated power of a given power generation module is equal to or smaller than a predetermined value and lasts for a predetermined period;

(b) determining that a power generation abnormal state occurs when generated power a given power generation module is lower than that of an adjacent power generation module by a predetermined value; and (c) determining that a power generation abnormal state occurs when total generated power in a predetermined period is lower than a past total generated power by a predetermined value.

Another embodiment of the present disclosure can be configured as follows.

(1) A power generation apparatus includes, a measurement unit configured to measure an output voltage and a temperature of at least one power generation module, a power calculation unit configured to calculate power on the basis of information about the output voltage and the temperature measured by the measurement unit, and an output unit configured to output information about the power calculated by the power calculation unit, and wherein the power calculation unit uses an equivalent circuit model of the power generation module to calculate the power on the basis of the information about the output voltage and the temperature.

(2) The power generation apparatus according to (1), wherein the output unit is a display unit configured to display the information about the power calculated by the power calculation unit.

(3) The power generation apparatus according to (1) or (2), further including a state determination unit configured to determine a state of the power generation module on the basis of the information about the power calculated by the power calculation unit.

(4) The power generation apparatus according to any one of (1), (2), and (3), further including an illumination level measurement unit configured to measure an illumination level of light emitted onto the power generation module and supply information about the measured illumination level to the power calculation unit.

(5) The power generation apparatus according to any one of (1), (2), (3), and (4),
wherein a transmitter transmits the information about the output voltage and the temperature measured by the measurement unit,
wherein a receiver receives the information about the output voltage and the temperature and supplies the received information about the output voltage and the temperature to the power calculation unit, and
wherein the power calculation unit outputs the information about the power to the output unit.

(6) The power generation apparatus according to any one of (1), (2), (3), and (4),
wherein a transmitter transmits the information about the output voltage and the temperature measured by the measurement unit, and
wherein a receiver receives the information about the output voltage and the temperature, transmits the received information about the output voltage and the temperature to the power calculation unit disposed outside the receiver, receives the information about the power from the power calculation unit, and outputs the received information about the power to the output unit.

(7) The power generation apparatus according to any one of (1), (2), (3), and (4),
wherein the information about the output voltage and the temperature measured by the measurement unit is supplied to the power calculation unit,
wherein the information about the power calculated by the power calculation unit is transmitted from a transmitter, and
wherein a receiver receives the information about the power and outputs the received information about the power to the output unit.

Modification

Embodiments of the present disclosure have been described in detail. However, the present disclosure is not limited to the embodiments, and various changes can be made on the basis of the spirit and scope of the present disclosure. For example, in the above-described embodiments, the present disclosure is applied to a solar cell module. However, the present disclosure may be applied to a power generation element other than a solar cell module.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A power generation apparatus, comprising:
a power calculation unit configured to:
receive voltage information, temperature information, and an identifier associated with each power generation module, of a plurality of power generation modules;
compare the received identifier of each of the plurality of power generation modules with a pre-stored identifier associated with the corresponding power generation module;
authenticate each of the plurality of power generation modules based on the comparison; and
calculate a value of current generated by the authenticated power generation module based on the received voltage information and the received temperature information of the authenticated power generation module; and
a state determination unit configured to:
determine an operating state of one or more authenticated power generation modules based on power generation information associated with the corresponding authenticated power generation module,
wherein the power generation information is determined based on the calculated value of the current and the received voltage information, and
wherein, the operating state is detected as a deteriorated state based on an amount of generated power indicated in the power generation information of the corresponding authenticated power generation module that is less than a determined threshold for a determined time duration.

2. The power generation apparatus according to claim 1, wherein the state determination unit is further configured to detect a failed state of the one or more authenticated power generation modules.

3. The power generation apparatus according to claim 1, further comprising an output unit configured to output the power generation information.

4. The power generation apparatus according to claim 3, wherein the output unit is a display unit configured to display the power generation information.

5. The power generation apparatus according to claim 1, further comprising:
a transmitter configured to transmit the voltage information and the temperature information; and
a receiver communicatively coupled to the transmitter and configured to receive the voltage information and the temperature information transmitted by the transmitter.

6. The power generation apparatus according to claim 5, wherein a communication path between the receiver and the transmitter is a wireless connection.

7. The power generation apparatus according to claim 5, further comprising a voltage and temperature measurement unit configured to:
measure the voltage information and the temperature information from the corresponding power generation module; and
transfer the voltage information and the temperature information to the transmitter.

8. The power generation apparatus according to claim 7, wherein the voltage and temperature measurement unit comprises:
a regulator configured to stabilize a voltage output from the corresponding power generation module; and
first and second resistors connected to the regulator and configured to divide the voltage output from the corresponding power generation module based on the voltage output from the corresponding power generation module being higher than a rated voltage of the regulator.

9. The power generation apparatus according to claim 1, further comprising:
a transmitter; and
a receiver communicatively coupled to the transmitter.

10. The power generation apparatus according to claim 1, wherein the power calculation unit is positioned on a transmission side of the power generation apparatus, and the state determination unit is positioned on a reception side of the power generation apparatus.

11. The power generation apparatus according to claim 1, further comprising an illumination measurement unit configured to obtain a value of current based on the corresponding power generation module being in a shorted condition.

12. The power generation apparatus according to claim 1, further comprising an illumination measurement unit configured to obtain a value of voltage based on the corresponding power generation module being in an open condition.

13. The power generation apparatus according to claim 1, wherein the value of current is calculated using a computational model based on the received voltage information and the received temperature information.

14. The power generation apparatus according to claim 1, wherein the operating state is further detected as the deteriorated state, based on the amount of generated power indicated in the generated power information of the corresponding authenticated power generation module being less than the amount of generated power indicated in power generation information of an adjacent power generation module by a determined value.

15. A method of determining an operating state of a power generation apparatus, the method comprising:
receiving voltage information, temperature information, and an identifier associated with each power generation module, of a plurality of power generation modules;
comparing the received identifier of each of the plurality of power generation modules with a pre-stored identifier associated with the corresponding power generation module;
authenticating each of the plurality of power generation modules based on the comparison;
calculating a value of current generated by the authenticated power generation module based on the received voltage information and the received temperature information of the authenticated power generation module; and
determining the operating state of the authenticated power generation module based on the calculated value of the current generated by the authenticated power generation module,
wherein the power generation information is determined based on the calculated value of the current and the received voltage information, and
wherein, the operating state is detected as a deteriorated state based on an amount of generated power indicated in the power generation information of the authenticated power generation module that is less than a determined threshold for a determined time duration.

16. The method according to claim 15, further comprising determining whether the operating state of the one or more authenticated power generation modules is a failed state.

17. The method according to claim 15, further comprising outputting the power generation information.

18. The method according to claim 17, wherein outputting the power generation information includes displaying the power generation information on a display device.

19. The method according to claim 15, further comprising:
transmitting the voltage information and the temperature information by a transmitter; and
receiving the transmitted voltage information and the temperature information by a receiver.

20. The method according to claim 19, further comprising:
measuring the voltage information and the temperature information from the corresponding power generation module by a voltage and temperature measurement unit; and
transferring the voltage information and the temperature information to the transmitter.

21. The method according to claim 20, wherein the voltage and temperature measurement unit comprises:
a regulator configured to stabilize a voltage output from the corresponding power generation module; and
first and second resistors connected to the regulator and configured to divide the voltage output from the corresponding power generation module based on the voltage output from the corresponding power generation module being higher than a rated voltage of the regulator.

22. The method according to claim 20, wherein the power generation apparatus further includes a plurality of voltage and temperature measurement units corresponding to the plurality of power generation modules, wherein the plurality of power generation modules is connected in series, and the method further comprises:
combining the voltage information and the temperature information output from the plurality of voltage and temperature measurement units with a multiplexer.

* * * * *